US012424830B2

(12) United States Patent
Horvath

(10) Patent No.: US 12,424,830 B2
(45) Date of Patent: Sep. 23, 2025

(54) POWER DISTRIBUTION BOX WITH AMPERAGE READINGS

(71) Applicant: Kenneth Horvath, Prescott, AZ (US)

(72) Inventor: Kenneth Horvath, Prescott, AZ (US)

(*) Notice: Subject to any disclaimer, the term of this patent is extended or adjusted under 35 U.S.C. 154(b) by 338 days.

(21) Appl. No.: 18/298,564

(22) Filed: Apr. 11, 2023

(65) Prior Publication Data

US 2023/0327409 A1 Oct. 12, 2023

Related U.S. Application Data

(60) Provisional application No. 63/330,025, filed on Apr. 12, 2022.

(51) Int. Cl.
| | |
|---|---|
| *H02B 1/46* | (2006.01) |
| *G01R 21/133* | (2006.01) |
| *H01R 13/518* | (2006.01) |
| *H01R 13/713* | (2006.01) |

(52) U.S. Cl.
CPC ............ *H02B 1/46* (2013.01); *G01R 21/133* (2013.01); *H01R 13/518* (2013.01); *H01R 13/7135* (2013.01)

(58) Field of Classification Search
CPC ... H02B 1/03; H02B 1/06; H02B 1/46; H02B 3/00; H01R 13/713; H01R 13/7135; H01R 25/006; H02H 3/16; H05K 5/0017; H05K 5/03; H05K 7/1427; G01R 13/02; G01R 13/32; G01R 13/325; G01R 13/345; G01R 13/401–407; G01R 21/33; G06F 1/189; G06F 1/266; G06F 1/3218; G06F 3/1423; G06F 3/147; G09G 2330/02; G09G 2360/04; G09G 5/003
See application file for complete search history.

(56) References Cited

U.S. PATENT DOCUMENTS

| | | | |
|---|---|---|---|
| 7,961,111 B2 * | 6/2011 | Tinaphong | H02H 9/042 340/649 |
| 7,982,335 B2 * | 7/2011 | Aldag | H01R 25/142 307/11 |
| 10,476,218 B1 * | 11/2019 | Chen | H01R 25/006 |
| 11,855,420 B1 * | 12/2023 | Nguyen | H02B 1/48 |
| 2006/0072269 A1 * | 4/2006 | Staples | G01R 19/16571 361/93.1 |
| 2007/0006603 A1 * | 1/2007 | Reusche | G01K 3/00 62/196.4 |
| 2008/0094210 A1 * | 4/2008 | Paradiso | H04L 12/2827 340/540 |
| 2010/0194194 A1 * | 8/2010 | Slessman | H01R 27/02 361/624 |
| 2021/0273418 A1 | 9/2021 | Stier | |

* cited by examiner

*Primary Examiner* — Amir A Jalali
(74) *Attorney, Agent, or Firm* — Zeman-Mullen & Ford, LLP

(57) ABSTRACT

A power distribution box having a plurality of power outlet receptacles and a plurality of amperage meter readers or amperage devices where a separate amperage meter reader or amperage device is associated with each of the power outlet receptacles. The power distribution box may also include a plurality of circuit breakers where a separate circuit breaker is associated with each of the power outlet receptacles.

11 Claims, 3 Drawing Sheets

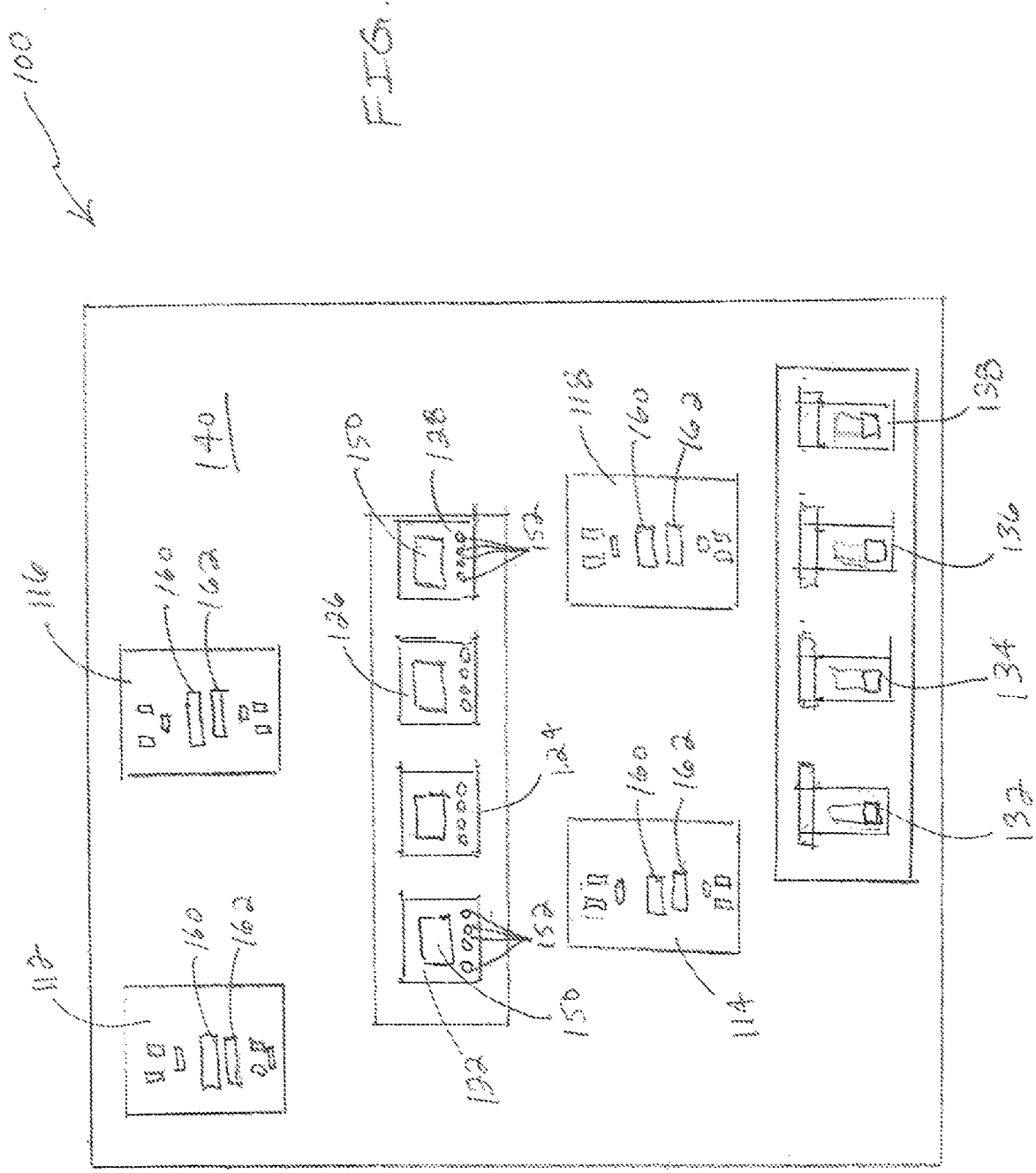

POWER DISTRIBUTION BOX WITH AMPERAGE READINGS

CROSS-REFERENCE TO RELATED APPLICATIONS

This application claims priority to provisional patent application having Ser. No. 63/330,025, filed Apr. 12, 2022, which is herein incorporated by reference in its entirety.

BACKGROUND OF THE INVENTION

It is important that certain amperage values are not exceeded on circuits during the use of electrically powered devices or tools. The present invention is directed to a power distribution box with an amperage meter reader or amperage device associated with each power outlet.

SUMMARY OF THE INVENTION

One exemplary embodiment of the present invention is directed to a power distribution box having an amperage meter reader associated with each power outlet on the power distribution box. More specifically, the present invention is directed to a power distribution box having a plurality of power outlet receptacles and a plurality of amperage meter readers wherein an individual amperage meter reader is respectively associated with an individual power outlet receptacle to measure the flow of electric current in the circuit associated with the individual power outlet receptacle. The power distribution box may include a main power outlet receptacle is located on a side of the power distribution box for providing electric current to each of the plurality of power outlet receptacles. The plurality of power outlet receptacles may each comprise a ground fault circuit interrupter (GFI) receptacle having a reset button and a test button. Further, the plurality of power outlet receptacles and the plurality of amperage meter readers may be located on a top panel of the power distribution box and the plurality amperage meter readers may be positioned within an elevated area of the top panel of the power distribution box. In addition, the power distribution box may include a plurality of circuit breakers wherein an individual circuit breaker is respectively associated with an individual power outlet receptacle.

Another exemplary embodiment of the present invention is directed to a power distribution box which includes a plurality of power outlet receptacles and a plurality of amperage devices each having one or more selection buttons for selecting an amperage range wherein each amperage device is in communication with a different power outlet receptacle from the plurality of power outlet receptacles and wherein the amperage device is capable of stopping an electrical current if the amperage value exceeds a selected amperage range. The power distribution box may include a main power outlet receptacle is located on a side of the power distribution box for providing electric current to each of the plurality of power outlet receptacles. The plurality of power outlet receptacles may each comprise a ground fault circuit interrupter (GFI) receptacle having a reset button and a test button. Further, the plurality of power outlet receptacles and the plurality of amperage meter readers may be located on a top panel of the power distribution box and the plurality amperage meter readers may be positioned within an elevated area of the top panel of the power distribution box. In addition, the power distribution box may include a plurality of circuit breakers wherein an individual circuit breaker is respectively associated with an individual power outlet receptacle.

Yet another exemplary embodiment of the power distribution box of the present invention includes a plurality of power outlet receptacles, a plurality of amperage devices each having one or more selection buttons for selecting an amperage range wherein each amperage device is in communication with a different power outlet receptacle from the plurality of power outlet receptacles, and a plurality of circuit breakers wherein an individual circuit breaker is respectively associated with an individual power outlet receptacle; wherein the plurality of power outlet receptacles, the plurality of amperage devices and the plurality of circuit breakers are all located on a top panel of the power distribution box and the plurality of amperage devices are positioned within an elevated area of the top panel of the power distribution box. The amperage device may be capable of stopping an electrical current if the amperage value exceeds a selected amperage range. In addition, the power distribution box may include a main power outlet receptacle is located on a side of the power distribution box for providing electric current to each of the plurality of power outlet receptacles and the plurality of power outlet receptacles may each comprise a ground fault circuit interrupter (GFI) receptacle having a reset button and a test button.

BRIEF DESCRIPTION OF THE DRAWINGS

The subject invention will hereinafter be described in conjunction with the appended drawing figures, wherein like numerals denote like elements.

FIG. 3 is a top plan view of another exemplary embodiment of the power distribution box in accordance with the present invention which shows a different layout of the power outlet receptacles and the amperage devices.

DETAILED DESCRIPTION OF EXEMPLARY EMBODIMENTS

Figure 1:
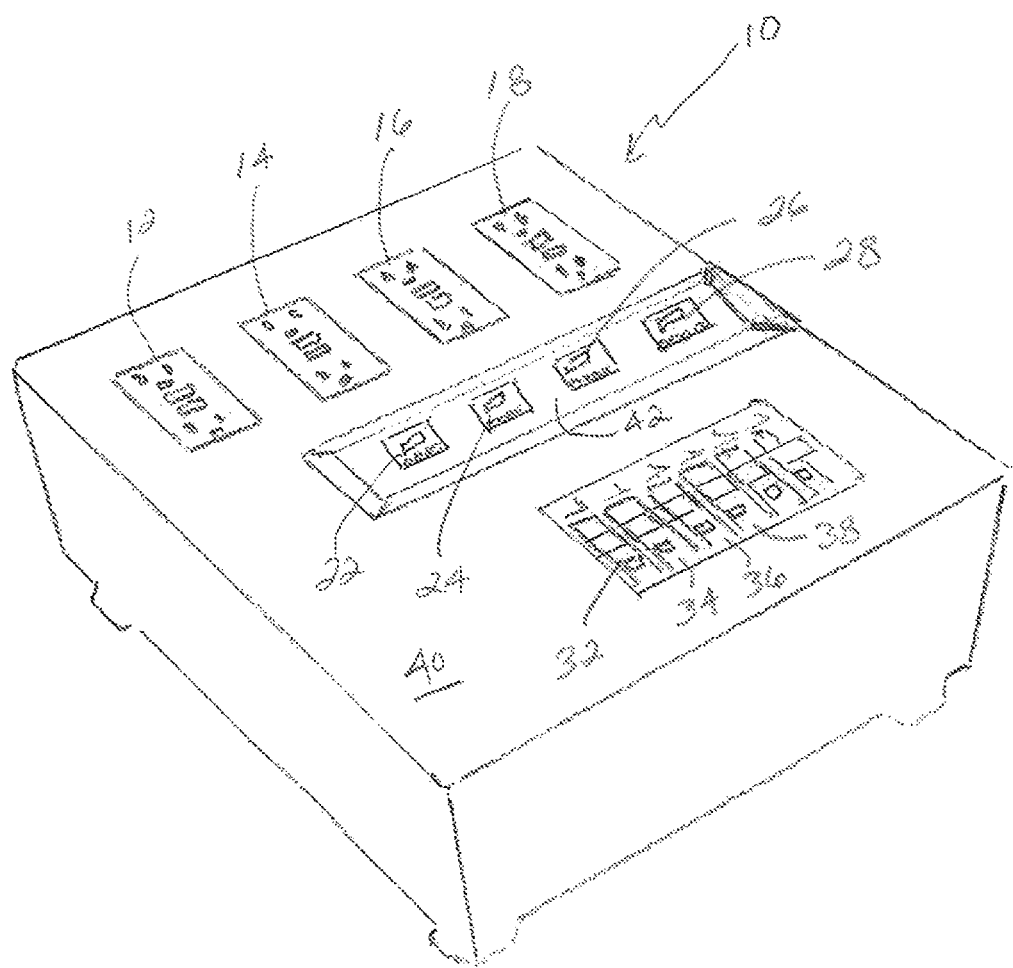
FIG. 1 is a perspective view of one exemplary embodiment of the power distribution box in accordance with the present invention where the power distribution box includes an individual amperage device associated with each power outlet receptacle of the distribution box.

One exemplary embodiment of the power distribution box of the present invention is shown in FIG. 1. Power distribution box 10 includes a plurality of power outlet receptacles 12, 14, 16, 18 and a plurality of amperage meter readers or amperage devices 22, 24, 26, 28 which are respectively individually associated with the plurality of power outlet receptacles. The power distribution box 10 also includes a plurality of circuit breakers 32, 34, 36, 38 which are also respectively associated with the plurality of power outlet receptacles 12, 14, 16, 18 to provide protection from power overload. The present invention enables a user to monitor the amperage associated with each of the power outlets of the power distribution box in order to avoid overloading circuits prior to setting off circuit breakers associated with the respective power outlets when the power distribution box includes amperage meter readers. If the power distribution box includes amperage devices that enable setting of an amperage range for each specific power outlet receptacle, then the circuit breakers associated with the separate outlets provide a backup for protecting equipment being powered by a specific power outlet by interrupting the current flow in the electric circuit in the event that the amperage device fails to stop the electric current if the amperage value exceeds the selected amperage range. The present invention enables multiple pieces of equipment powered by a power distribution box to be protected from damage and avoid causing damage from fire due to including two separate means for interrupting the electric current associated with each of separate power outlet receptacles.

Power distribution box 10 includes a top panel 40. The plurality of power outlet receptacles 12, 14, 16, 18, the plurality of amperage meter readers or amperage devices 22, 24, 26, 28, and the plurality of circuit breakers 32, 34, 36, 38 are all located on the top panel 40 of the power distribution box 10 with the plurality of amperage meter readers or amperage devices 22, 24, 26, 28 being positioned within an elevated area 42 of the top panel 40.

Figure 2:
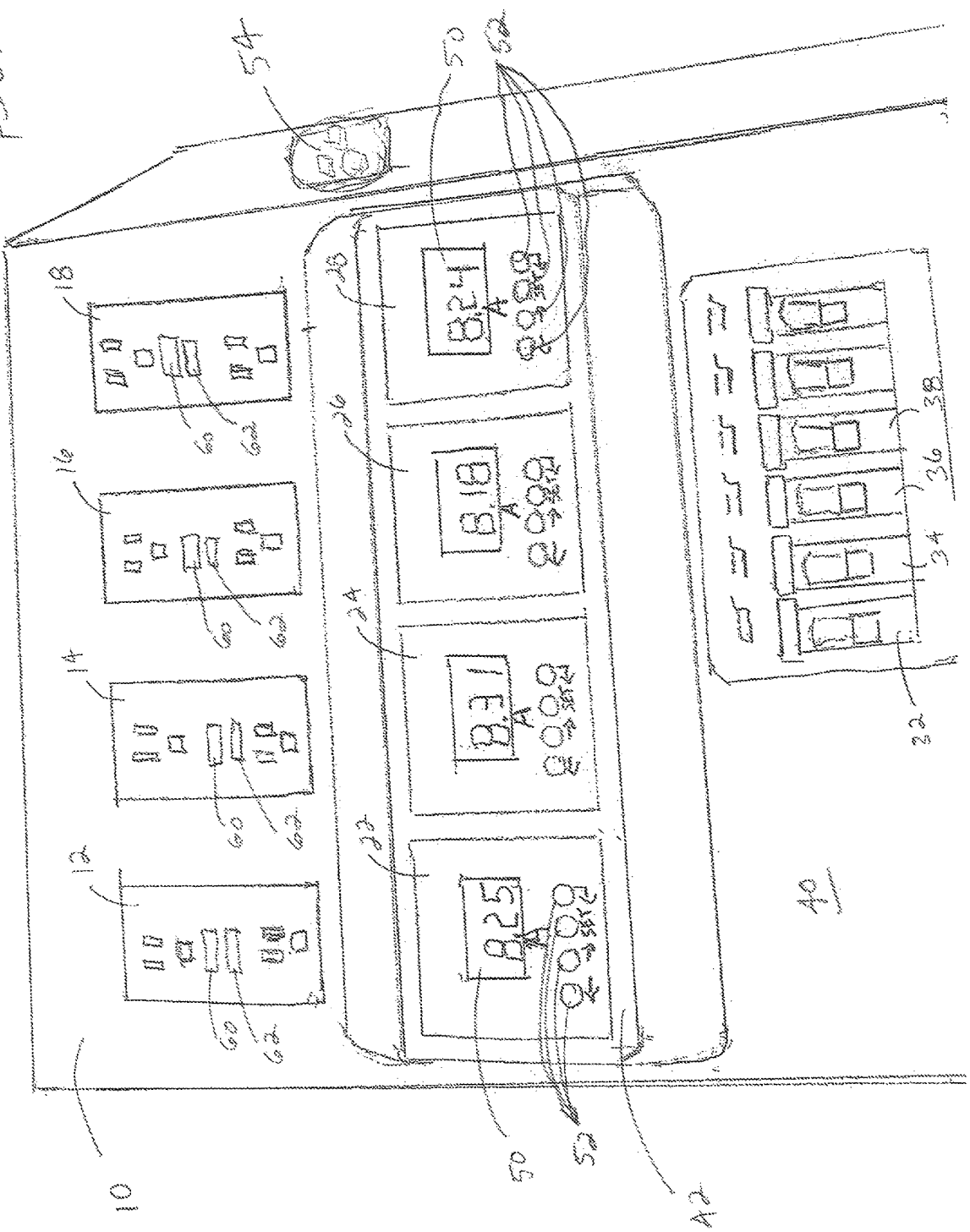
FIG. 2 is an enlarged partial top perspective view of the power distribution box shown in FIG. 1 which shows the plurality of amperage devices in more detail.

FIG. 2 is an enlarged partial top perspective view of the power distribution box shown in FIG. 1 which shows the plurality of amperage devices in more detail. Amperage devices 22, 24, 26, 28 each include a digital amperage reading 50 and one or more selection buttons 52 for selecting an amperage range for the electric circuit that powers a piece of equipment with the power outlet receptacle associated with the respective amperage device. The power outlet receptacles 12, 14, 16, 18 shown in FIG. 2 are ground fault circuit interrupter (GFI) receptacles that each include a reset button 60 and a test button 62. Accordingly, the power distribution box 10 shown in FIG. 2 provides for yet another safety feature by shutting off electric power (or breaking the electrical circuit), to protect people from an electric shock caused when some of the current travels through a person's body due to an electrical fault such as a short circuit, insulation failure, or piece of equipment that is not working right. A main power outlet receptacle 54 is located on a side of the power distribution box for providing electric current to each of the plurality of power outlet receptacles.

A top plan view of another exemplary embodiment of the power distribution box 100 in accordance with the present invention is depicted in FIG. 3 which shows a different layout of the power outlet receptacles and the amperage devices. Power distribution box 100 includes a plurality of power outlet receptacles 112, 114, 116, 118 and a plurality of amperage meter readers or amperage devices 122, 124, 126, 128 which are respectively individually associated with the plurality of power outlet receptacles. The power distribution box 100 also includes a plurality of circuit breakers 132, 134, 136, 138 which are also respectively associated with the plurality of power outlet receptacles 112, 114, 116, 118 to provide protection from power overload. Power distribution box 100 includes a front panel 140. The plurality of power outlet receptacles 112, 114, 116, 118, the plurality of amperage meter readers or amperage devices 122, 124, 126, 128, and the plurality of circuit breakers 132, 134, 136, 138 are all located on the top panel 140 of the power distribution box 100. The plurality of amperage meter readers or amperage devices 122, 124, 126, 128 may be positioned within an elevated area of the top panel 140 as shown in FIGS. 1 and 2 to emphasize and call attention to the amperage readings on the different circuits. It is very important to not exceed certain amperage ranges on particular circuits and the elevated area for the amperage meter readers of amperage devices calls attention to the amperage readings and reminds a user to set amperage ranges when it may be important for particular circuits.

Amperage devices 122, 124, 126, 128 each include a digital amperage reading 150 and one or more selection buttons 152 for selecting an amperage range for the electric circuit that powers a piece of equipment with the power outlet receptacle associated with the respective amperage device. The power outlet receptacles 112, 114, 116, 118 are ground fault circuit interrupter (GFI) receptacles that each include a reset button 160 and a test button 162. FIG. 3 shows power outlet receptacles 112 and 116 positioned above the amperage devices 122, 124, 126, 128 and power outlet receptacles 114 and 118 shown below the amperage devices 122, 124, 126, 128 on the top panel 140 of the power distribution box 100. However, it will be understood that power outlet receptacles 112, 114, 116, 118, the amperage meter readers or amperage devices 122, 124, 126, 128, and circuit breakers 132, 134, 136, 138 may exhibit any number of positions on top panel 140 of the power distribution box 100 and still function to monitor and control the amperage associated with each of the power outlets of the power distribution box in order to avoid overloading circuits prior to setting off circuit breakers associated with the respective power outlets.

The description of exemplary embodiments of the invention herein shows various exemplary embodiments of the invention. These exemplary embodiments and modes are described in sufficient detail to enable those skilled in the art to practice the invention and are not intended to limit the scope, applicability, or configuration of the invention in any way. Rather, the following disclosure is intended to teach both the implementation of the exemplary embodiments and modes and any equivalent modes or embodiments that are known or obvious to those reasonably skilled in the art. Additionally, all included examples are non-limiting illustrations of the exemplary embodiments and modes, which similarly avail themselves to any equivalent modes or embodiments that are known or obvious to those reasonably skilled in the art.

Other combinations and/or modifications of structures, arrangements, applications, proportions, elements, materials, or components used in the practice of the instant invention, in addition to those not specifically recited, can be varied or otherwise particularly adapted to specific environments, manufacturing specifications, design parameters, or other operating requirements without departing from the scope of the instant invention and are intended to be included in this disclosure.

Unless specifically noted, it is the Applicant's intent that the words and phrases in the specification and the claims be given the commonly accepted generic meaning or an ordinary and accustomed meaning used by those of ordinary skill in the applicable arts. In the instance where these meanings differ, the words and phrases in the specification and the claims should be given the broadest possible, generic meaning. If any other special meaning is intended for any word or phrase, the specification will clearly state and define the special meaning.

The following claims are included as exemplary claims only and are not intended to define or limit the scope of patentable subject matter contained within the provisional patent application.

The invention claimed is:

1. A power distribution box having a plurality of power outlet receptacles each comprising a ground fault circuit interrupter (GFI) receptacle having a reset button and a test button and a plurality of amperage meter readers wherein an individual amperage meter reader is respectively associated with an individual power outlet receptacle to measure the flow of electric current in the circuit associated with the individual power outlet receptacle.

2. The power distribution box of claim 1 wherein a main power outlet receptacle is located on a side of the power distribution box for providing electric current to each of the plurality of power outlet receptacles.

3. The power distribution box of claim 1 wherein the plurality of power outlet receptacles and the plurality of amperage meter readers are located on a top panel of the power distribution box and the plurality amperage meter readers are positioned within an elevated area of the top panel of the power distribution box.

4. The power distribution box of claim 1 further comprising a plurality of circuit breakers wherein an individual circuit breaker is respectively associated with an individual power outlet receptacle.

5. A power distribution box comprising: a plurality of power outlet receptacles each comprising a ground fault circuit interrupter (GFI) receptacle having a reset button and a test button; and a plurality of amperage devices each having one or more selection buttons for selecting an amperage range wherein each amperage device is in communication with a different power outlet receptacle from the plurality of power outlet receptacles and wherein the amperage device is capable of stopping an electrical current if the amperage value exceeds a selected amperage range.

6. The power distribution box of claim 5 wherein a main power outlet receptacle is located on a side of the power distribution box for providing electric current to each of the plurality of power outlet receptacles.

7. The power distribution box of claim 5 wherein the plurality of power outlet receptacles and the plurality of amperage devices are located on a top panel of the power distribution box and the plurality amperage devices are positioned on an elevated area of the top panel.

8. The power distribution box of claim 5 further comprising a plurality of circuit breakers wherein an individual circuit breaker is respectively associated with an individual power outlet receptacle.

9. A power distribution box comprising: a plurality of power outlet receptacles each comprising a ground fault circuit interrupter (GFI) receptacle having a reset button and a test button; a plurality of amperage devices each having one or more selection buttons for selecting an amperage range wherein each amperage device is in communication with a different power outlet receptacle from the plurality of power outlet receptacles; and a plurality of circuit breakers wherein an individual circuit breaker is respectively associated with an individual power outlet receptacle; wherein the plurality of power outlet receptacles, the plurality of amperage devices and the plurality of circuit breakers are all located on a top panel of the power distribution box and wherein the plurality of amperage devices are positioned within an elevated area of the top panel of the power distribution box.

10. The power distribution box of claim 9 wherein the amperage device is capable of stopping an electrical current if the amperage value exceeds a selected amperage range.

11. The power distribution box of claim 10 wherein a main power outlet receptacle is located on a side of the power distribution box for providing electric current to each of the plurality of power outlet receptacles.

* * * * *